US006902959B2

United States Patent
Kim et al.

(10) Patent No.: US 6,902,959 B2
(45) Date of Patent: Jun. 7, 2005

(54) SEMICONDUCTOR DEVICE HAVING JUNCTION DIODE AND FABRICATING METHOD THEREFOR

(75) Inventors: Young-Kwang Kim, Suwon (KR); Hee-Sung Kang, Songnam (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/775,270

(22) Filed: Feb. 10, 2004

(65) Prior Publication Data

US 2004/0161885 A1 Aug. 19, 2004

Related U.S. Application Data

(62) Division of application No. 09/645,285, filed on Aug. 24, 2000, now Pat. No. 6,717,209.

(30) Foreign Application Priority Data

Oct. 5, 1999 (KR) .............................................. 99-42805

(51) Int. Cl.[7] .............................................. H01L 21/20
(52) U.S. Cl. ...................................... 438/141; 438/197
(58) Field of Search ................................ 438/141, 142, 438/91, 237, 414, 926, 979, 983, 680, 689, 692, 706, 733, 197

(56) References Cited

U.S. PATENT DOCUMENTS

| | | | |
|---|---|---|---|
| 5,182,220 A | 1/1993 | Ker et al. ...................... 437/34 |
| 5,321,293 A | 6/1994 | Mojaradi et al. ............ 257/369 |
| 5,932,914 A | 8/1999 | Horiguchi ..................... 257/355 |
| 6,013,927 A | 1/2000 | Bothra et al. ................ 257/328 |
| 6,329,691 B1 | 12/2001 | Finzi ........................... 257/355 |
| 6,344,385 B1 | 2/2002 | Jun et al. ..................... 438/237 |
| 6,365,939 B1 * | 4/2002 | Noguchi ...................... 257/355 |
| 6,376,388 B1 | 4/2002 | Hashimoto et al. ......... 438/728 |
| 6,559,485 B2 | 5/2003 | Aoyama ....................... 257/211 |
| 6,717,209 B1 * | 4/2004 | Kim et al. ................... 257/328 |
| 2001/0039079 A1 | 11/2001 | Shin ............................ 438/142 |

* cited by examiner

*Primary Examiner*—David Nhu
(74) *Attorney, Agent, or Firm*—Mills & Onello LLP

(57) ABSTRACT

A semiconductor device having a junction diode and a fabricating method therefor prevents deterioration of the gate insulating layer during a plasma etching process required for wire formation. The semiconductor device includes a junction diode (a unidirectional or bi-directional junction diode) formed in the substrate at a predetermined distance apart from a gate wire of a transistor. The gate wire is coupled through an insulating layer to a metal wire, and the diode(s) are coupled to a dummy metal pattern formed proximal to the metal wire. In this manner, plasma charge generated during wire formation, is discharged into the semiconductor substrate through the junction diode, preventing accumulation of the plasma charge in the gate insulating layer of the device. Deterioration of the gate insulating layer is thereby avoided.

12 Claims, 11 Drawing Sheets

BI-DIRECTIONAL
JUNCTION DIODE

SEMICONDUCTOR DEVICE HAVING JUNCTION DIODE AND FABRICATING METHOD THEREFOR

RELATED APPLICATION

This application is a divisional of U.S. application Ser. No. 09/645,285, filed on Aug. 24, 2000 now U.S. Pat. No. 6,717,209, which relies for priority upon Korean Patent Application No. 99-42805, filed on Oct. 5, 1999, the contents of which are herein incorporated by reference in their entirety.

BACKGROUND OF THE INVENTION

1. Field of the Invention

The present invention relates to a semiconductor device and a fabricating method therefor, and more particularly to a semiconductor device having a junction diode and a fabricating method therefor wherein the junction diode is configured for preventing a gate insulating layer from deterioration arising from a plasma etch process necessary for device wire layout.

2. Description of the Prior Art

As ULSI semiconductor technology advances, there is an ever-increasing demand for high integration, fine wire and gate patterns, high performance, and wafers of large diameter and high yield. For this reason, the plasma process has become an indispensable technology in the field of semiconductor device fabrication.

Representative examples of plasma processes include the well-known processes of dry etching, thin layer deposition with plasma CVD, ashing, blanket etch-back and the like. As compared to the conventional wet-etching process, the dry-etching process offers the advantage of enabling ultra-fine pattern formation due to its anisotropic etching properties. For this reason, dry-etching has become widely used for highly integrated device fabrication.

Figure 1:
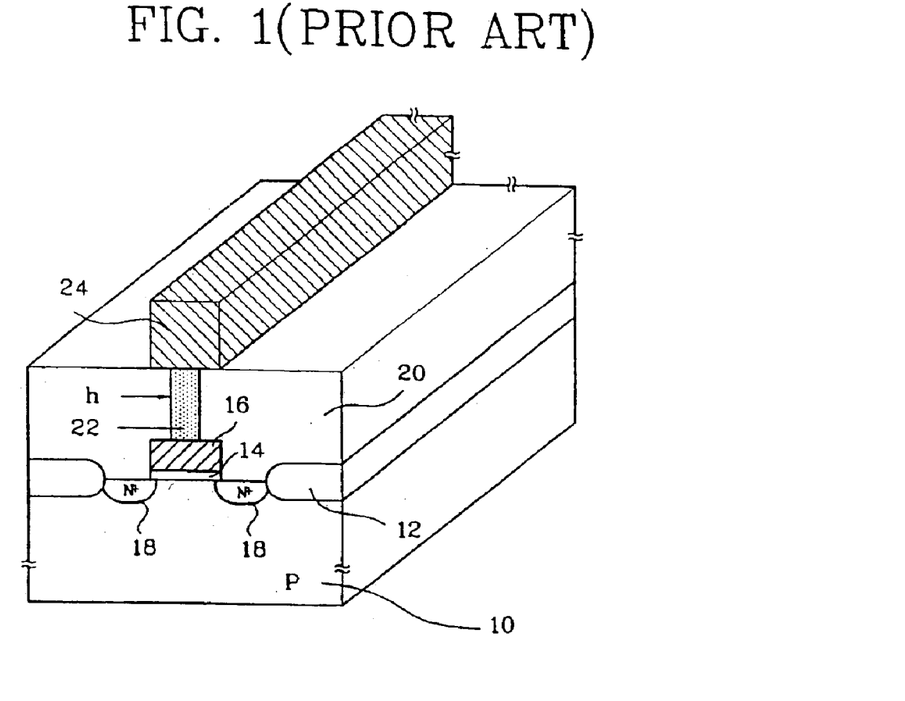
FIG. 1 is a cross-sectional perspective view of a conventional semiconductor device.

FIG. 1 is a perspective view illustrating a conventional semiconductor device constructed under the aforementioned plasma process. For illustrative purposes, an NMOS transistor is described below.

In accordance with FIG. 1, the conventional semiconductor device includes: a field oxide layer 12 (for instance, P type) formed in a device isolating region on a semiconductor substrate 10 of a first conductivity type; a gate wire 16 positioned at a predetermined portion of an active region of the substrate 10 above a gate insulating layer 14; a high-density source/drain region 18 of a second conductivity type (for instance, N+ type) formed in the active region at both edges of the gate wire 16; an inter-level insulating layer 20 having contact holes (h) formed on the resultant structure of the prior processes to expose a predetermined portion of the surface of the gate wire 16; conductivity plugs 22 (for instance, W plug) formed in the contact holes; and a metal wire 24 formed on the inter-level insulating layer 20 connected to the device terminals via the conductivity plug 22.

Figure 2:
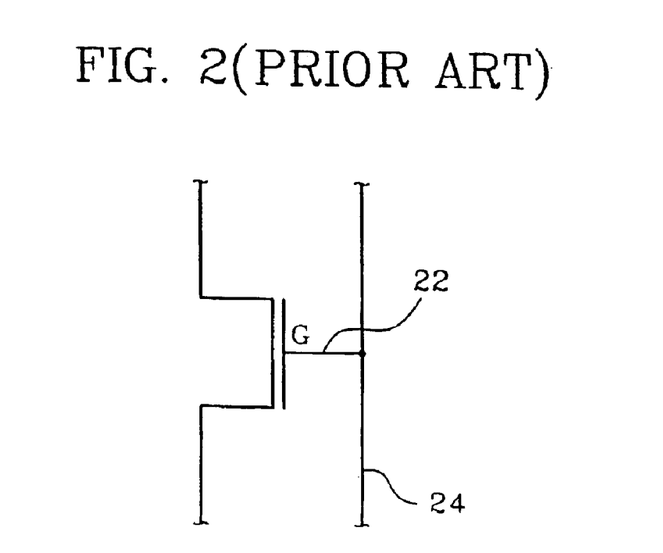
FIG. 2 is an equivalent schematic circuit diagram for the device of FIG. 1.

FIG. 2 is an equivalent circuit diagram of the semiconductor device shown in FIG. 1. As shown in the circuit, the device is constructed to enable the metal wire 24 to be electrically connected with the gate wire G of the NMOS transistor through the conductivity plug 22.

Fabrication of the aforementioned structure results in numerous problems and limitations in the finished device, as specified below.

During an etching process (for example a dry etching process utilized to form an interconnect wire 24, or an ashing process used to eliminate a photo resist layer pattern or the like) employing a plasma process, a large quantity of irregular charge (referred to as "plasma charge") can form. As a result, during etching, a portion of the plasma charge can become infused along lateral walls of, or on the surface of, the metal layer of the wire 24.

Accordingly, the plasma charge infused into the metal layer is collected and blocked by the gate insulating layer 14, which often times becomes a major cause of a damage to the gate insulating layer 14, referred to in the art as "plasma damage". In other words, the plasma damage is imparted on the gate insulating layer because the device is constructed to migrate the plasma charge generated during the course of the plasma etching process through the conductivity plug 22 and the gate wire 16 toward the gate insulating layer 14.

In the case of plasma damage, the accumulated charge, and the resulting impurities in the gate insulating layer 14, cause a reduction in performance of the semiconductor device. However, in the case of a severe defect, for example if the deterioration is so profound so as to reduce the thickness of the gate insulating layer 14 to less than 100 angstroms, a total breakdown of the gate insulating layer 14 is likely, which further reduces the reliability of the semiconductor device.

In addition to immediate damage, which often times can be screened at an early stage, a large number of plasma-damage-related defects are detectable only at relatively later stages during device lifetime, for example when the semiconductor device is deployed and used by consumers. For this reason, there is a need to address and resolve the aforementioned limitations.

SUMMARY OF THE INVENTION

It is therefore an object of the present invention to provide a semiconductor device having a junction diode (for example a unidirectional or bi-directional junction diode), in the process of forming a wire in the device. The junction diode serves as a pathway for excessive plasma charge, generated during the plasma etching process of wire formation, to be discharged through the semiconductor substrate.

The semiconductor device includes a junction diode (a unidirectional or bi-directional junction diode) formed in the substrate at a predetermined distance apart from a gate wire of a transistor. The gate wire is coupled through an insulating layer to a metal wire, and the diode(s) are coupled to a dummy metal pattern formed proximal to the metal wire. In this manner, plasma charge generated during wire formation, is discharged into the semiconductor substrate through the junction diode, preventing accumulation of the plasma charge in the gate insulating layer of the device. Deterioration of the gate insulating layer is thereby avoided.

It is another object of the present invention to provide a method for fabricating the semiconductor device constructed as described above.

In order to accomplish the aforementioned object of the present invention, there is provided a semiconductor device having a junction diode in a first embodiment of the present invention comprising: a first conductivity-type semiconductor substrate; a gate wire formed over a gate insulating layer on a predetermined portion of the substrate; second conductivity-type source/drain regions formed in the substrate at opposite edges of gate wire; a second conductivity-type junction diode formed in the substrate at a predetermined distance apart from the source/drain regions; an inter-level insulating layer formed over the gate wire, the source/drain regions and the junction diode; first and second contact holes penetrating through the inter-level insulating layer to expose predetermined portions of the gate wire and junction diode; first and second conductivity plugs formed in the respective first and second contact holes; a metal wire formed on a predetermined portion of the inter-level insulating layer coupled with the gate wire through the first conductivity plug; and a dummy metal pattern formed on the inter-level insulating layer at a predetermined distance apart from the metal wire coupled with the junction diode through the second conductivity plug.

The dummy metal pattern may be configured in a linear stripe or double folded shape. It is preferable that the dummy metal pattern is shorter than the metal wire in total length. Furthermore, the dummy metal pattern and the metal wire may comprise the same material, and a gap width W between the metal wire and the dummy metal pattern is preferably formed at less than 2 micro-meter ($\mu$m), the width W representing the minimum horizontal distance between the metal wire and the dummy metal pattern.

In order to accomplish the aforementioned object of present invention, there is additionally provided a semiconductor device having a junction diode in a second embodiment of the present invention comprising: a semiconductor substrate including first and second conductivity-type wells; a gate wire formed over a gate insulating layer on a predetermined portion of the first conductivity-type well; source/drain regions formed in the first conductivity-type well at opposite edges of gate wire; a second conductivity-type first junction diode formed in the first conductivity-type well at a predetermined distance apart from the source/drain regions; a first conductivity-type second junction diode formed in the second conductivity-type well at a predetermined distance apart from the first junction diode; an inter-level insulating layer formed over the gate wire, the source/drain regions, and the first and second junction diodes; first, second and third contact holes penetrating through the inter-level insulating layer to expose predetermined portions of the gate wire and the first and second junction diodes; first, second and third conductivity plugs formed in the respective first, second and third contact holes; a metal wire formed on a predetermined portion of the inter-level insulating layer coupled with the gate wire through the first conductivity plug; and a dummy metal pattern formed on the inter-level insulating layer at a predetermined distance apart from the metal wire coupled with the first and second junction diodes through the second and third conductivity plugs, respectively.

In order to accomplish a further object of the present invention, there is provided a method for fabricating the semiconductor device having a junction diode in the first embodiment of the present invention, the method comprising: forming a gate wire over a gate insulating layer on a predetermined portion of an active region of a first conductivity-type semiconductor substrate; forming source/drain regions in the substrate at opposite edges of the gate wire by selectively ion-implanting a high density of a second conductivity-type impurity; forming a second conductivity-type junction diode in the substrate at a predetermined distance apart from the source/drain regions; forming an inter-level insulating layer having a plurality of contact holes to expose predetermined portions of the gate wire and junction diode; forming conductivity plugs in the contact holes; forming a metal layer on the inter-level insulating layer; and simultaneously forming a metal wire coupled to the gate wire, and a dummy metal pattern coupled to the junction diode by selectively etching the metal layer to expose predetermined portions of the surface of the inter-level insulating layer.

In order to accomplish a further object of the present invention, there is provided a method for fabricating the semiconductor device in the second embodiment of the present invention, the method comprising: sequentially forming first and second conductivity-type wells in a semiconductor substrate; forming a gate wire over a gate insulating layer on a predetermined portion of the first conductivity-type well; forming source/drain regions in the first conductivity well at opposite edges of the gate wire by selectively ion implanting a high density of a second conductivity-type impurity in the first conductivity-type well; forming a second conductivity-type first junction diode in the first conductivity-type well at a predetermined distance apart from the source/drain regions; forming a first conductivity-type second junction diode in the second conductivity-type well at a predetermined distance from the first junction diode; forming a second junction diode formed in the second conductivity well at a predetermined distance apart from the first junction diode by selectively ion-implanting a high density of first conductivity-type impurity in the second conductivity-type well; forming an inter-level insulating layer over the gate wire and the first and second junction diodes, the inter-level insulating layer including a plurality of contact holes to expose predetermined portions of the gate wire and first and second diodes; forming conductivity plugs in the contact holes; forming a metal layer on the inter-level insulating layer; simultaneously forming a metal wire coupled to the gate wire, and a dummy metal pattern coupled to the first and second junction diodes by selectively etching the metal layer to expose predetermined portions of the surface of the inter-level insulating layer.

In a semiconductor device configured according to the aforementioned structure and method, the dummy metal pattern and the first and second junction diodes promote flow of the plasma charge generated during the process of wire formation toward the substrate, thereby mitigating and/or preventing plasma damage to the gate insulating layer.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PRESENT INVENTION

The preferred embodiments of the present invention will now be described with reference to the accompanying drawings of FIGS. 3–12. The apparatus and methods of the present invention mitigate and/or prevent deterioration of the gate insulating layer due to plasma damage caused during formation of metal wires my processes employing the plasma etching process.

A first embodiment of the present invention is described with reference to the accompanying drawings of FIGS. 3 through 7D, which depict a semiconductor device employing a unidirectional junction diode.

Figure 3:
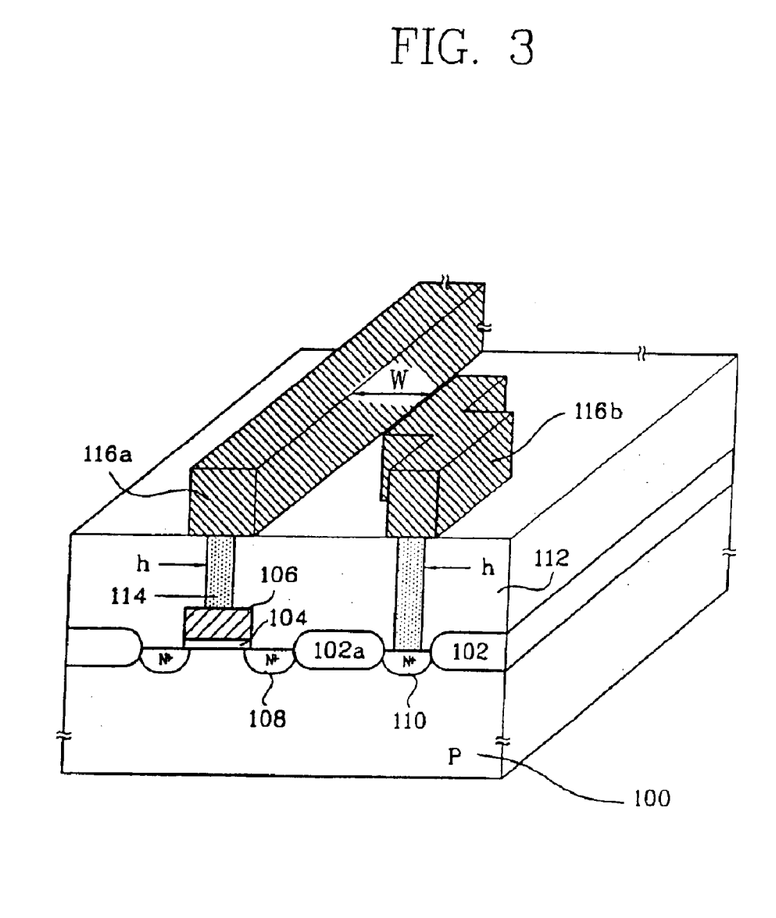
FIG. 3 is a cross-sectional perspective view of a semiconductor device having a unidirectional junction diode in accordance with a first embodiment of the present invention.
Figure 4:
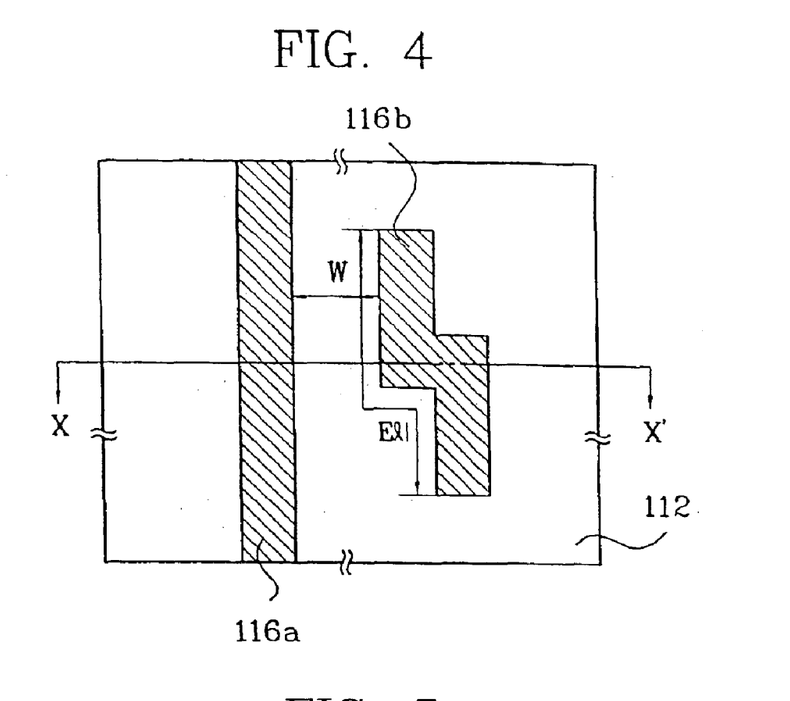
FIG. 4 is a top view of the semiconductor device of FIG. 3.
Figure 5:
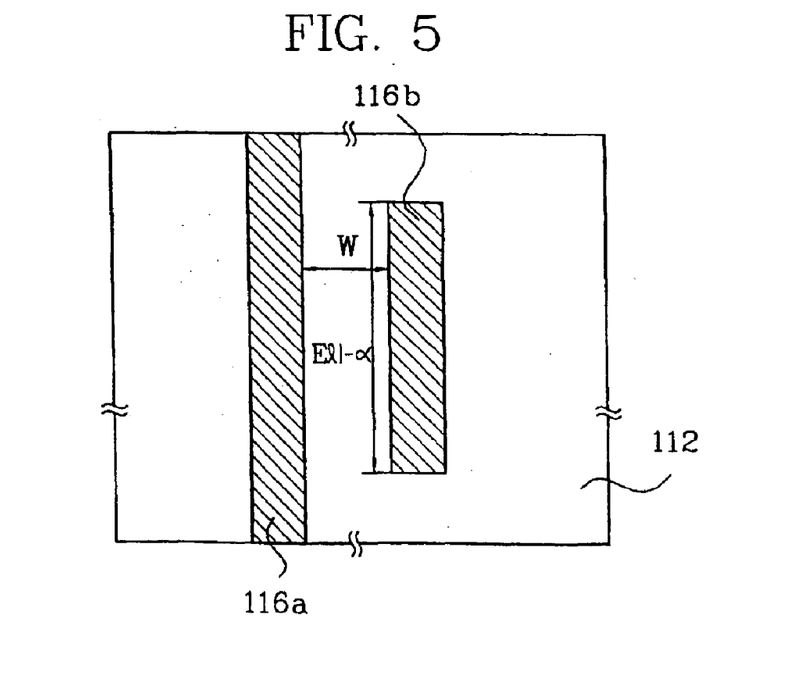
FIG. 5 is a top view of the semiconductor device of FIG. 3, illustrating an alternative embodiment.

FIG. 3 is a perspective cross-sectional view of a semiconductor device having a unidirectional junction diode (for example, a N+/P diode or P+/N diode) in accordance with a first embodiment of the present invention. FIG. 4 is a top plane view of the device according to a first dummy metal pattern (described below) and FIG. 5 is a top plane view of the device according to a second modified embodiment of the dummy metal pattern. The cross-sectional view of FIG. 3 is taken along line X–X' of FIG. 4.

The first embodiment of the present invention applies equally well to both NMOS and PMOS devices, the only difference being in the type of impurity to be ion-implanted. For the sake of example, an NMOS transistor structure is described below.

As shown in FIGS. 3 and 4, in accordance with the first embodiment of the present invention, the semiconductor device comprises: a field oxide layer 102 formed on a device isolating region of a first conductivity type (for instance, P type) semiconductor substrate 100; a gate wire 106 formed on a predetermined portion of the substrate 100 above a gate insulating layer 104; second conductivity type (for instance, N+0 type) source/drain regions 108 formed in the substrate at both edges of the gate wire 106; a second conductivity type (for instance, N+ type) junction diode 110 formed at a position which lies a predetermined distance apart from the source/drain regions 108 in parallel to the gate wire 106 in the substrate 100; an inter-level insulating layer 112 formed with a plurality of contact holes (h) to expose predetermined portions of the surface of gate wire 106 and junction diode 110; conductivity plugs 114 (for example W plug) formed in the contact holes (h); a metal wire 116a longitudinally extended at a predetermined portion of the inter-level insulating layer 112 electrically connected with the gate line 106 through the conductivity plug 114; and a dummy metal pattern 116b placed on the inter-level insulating layer 112 at a predetermined distance (W) from the metal wire 116a electrically connected with the junction diode 110 through the conductivity plug 114, a portion of the dummy metal wire 116b being in parallel with metal wire 116a.

The dummy metal pattern 116b may be configured in a double-folded shape, as shown in FIGS. 3 and 4, or alternatively in a linear strip shape as shown in FIG. 5. The total effective length of the dummy metal pattern 116b exposed to the metal wire 116a is a length of "El 1" in the mutually occupying area in the double-folded case of FIG. 3, and an effective length of "El 1-α" in the linear strip case of FIG. 5. As a result, the former is more effective in providing a path for the excess plasma charge that generates during the plasma etching process to flow toward the substrate 100. These configurations are for illustrative purposes only, and these and other configurations are equally applicable to the present invention.

Since the dummy metal pattern 116b and the metal wire 116a are simultaneously formed by the same etching process, they may comprise identical material. It is preferable in terms of high integration of the device that the dummy metal pattern 116b is shorter in length than the metal wire 116a.

In addition, it is preferable that the gap width W between the metal wire 116a and the dummy metal pattern 116b is minimized, for example to less than 2 μm. If the gap width between the metal wire 116a and the dummy metal pattern 116b becomes much wider than this, then the plasma etching process responds by increasing metal density in that region, in order to speed up the etching process, contradicting the purpose of promoting plasma charge flow toward the substrate. For purposes of the present discussion, the width W is defined as the minimum horizontal distance between the metal wire 116a and the dummy metal pattern 116b.

Since the etch rate of the metal layer is slower for metal patterns having a relatively narrower interval (for example, less than 2 μm), the dummy metal pattern 116b, being spaced apart from the metal wire 116a by such a relatively narrow spacing W, will be etched relatively slowly, as compared to other wires adjacent the metal wire 116a. Thus, during etching, a large amount of plasma discharge flows from the metal wire 116a, into the dummy metal pattern 116b, and is discharged thorough the junction diode 110 and into the substrate 100.

Figure 6:
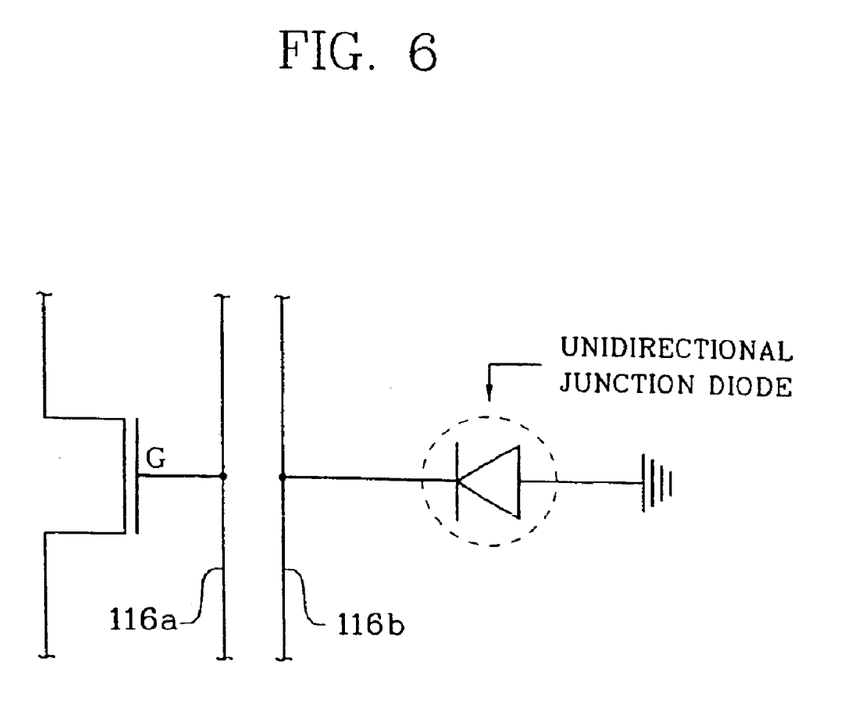
FIG. 6 is an equivalent schematic circuit diagram for the device of FIG. 3.

FIG. 6 is an equivalent circuit diagram of the semiconductor device shown in FIG. 3. As shown in the circuit diagram, the metal wire 116a is connected to the gate wire G of the NMOS transistor and the dummy metal wire 116b is connected to the junction diode (N+/P diode) positioned at a part of the gate wire G. It can be confirmed that the device is constructed for promoting the flow of plasma charge generated during the etching process through the diode toward the substrate.

The aforementioned semiconductor device can be fabricated according to the following steps as shown in the sequential fabricating processes of FIGS. 7A through 7D.

Figure 7A:
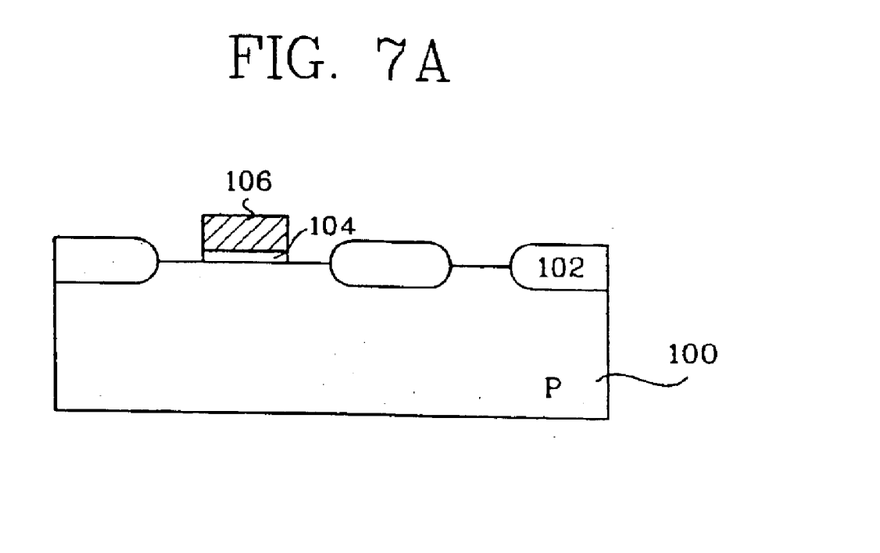
FIGS. 7A through 7D illustrate sequential steps for fabricating the semiconductor device shown in FIG. 3.

During the first step, as shown in FIG. 7A, an active region is defined by forming a field oxide layer 102 at a device isolating region of a first conductivity (P type) semiconductor substrate 100. Following formation of a gate insulating layer 104 on the active region of the substrate 100, a metal layer of polysilicon or polycide is formed over the resultant structure of the prior processes. Next, a photo resist pattern (not shown) restricting the gate wire forming part is used as a mask for sequentially etching the metal layer and gate insulating layer 104 to form a gate wire 106 over the active region of the substrate 100.

Figure 7B:
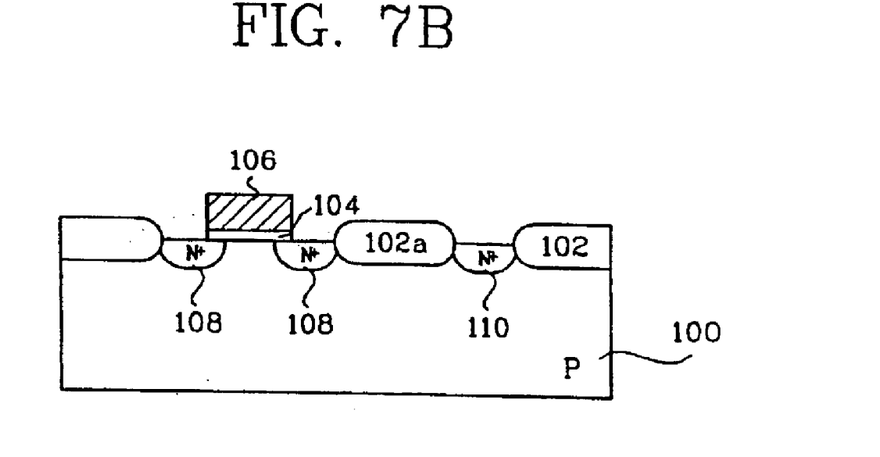

At the second step, as shown in FIG. 7B, a high density of a second conductivity (for instance, N type) impurity is selectively ion-implanted only into first active regions at the transistor-forming portions of the substrate 100, and in a second active region at a predetermined distance from the transistor forming part, the predetermined distance being defined by the width of the field oxide layer 102a. As a result, transistor source/drain regions 108 are formed in the substrate 100 at both edges of the gate wire 106, and a second conductivity junction diode (N+/P diode) 110 is formed in the active region at a predetermined distance from the source/drain region 108. At this time, the gate wire 106 is in parallel with the junction diode 110 on the substrate 100.

Figure 7C:
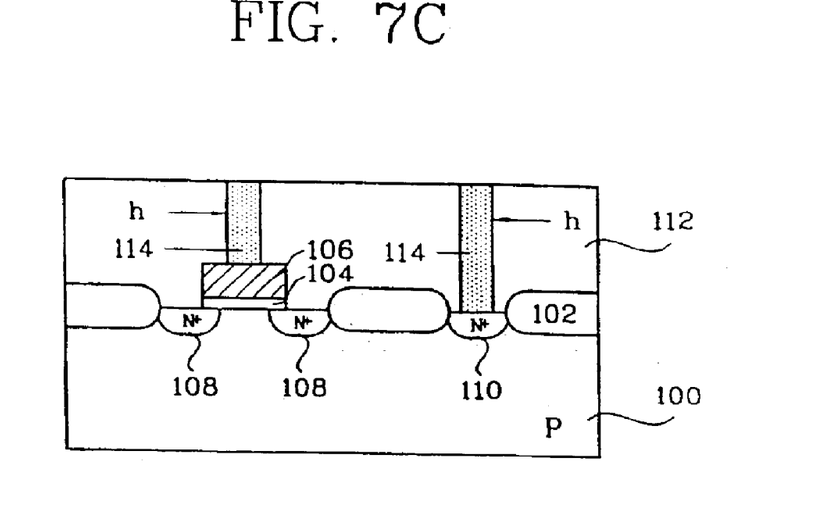

During the third step, as shown in FIG. 7C, an inter-level insulating layer 112 of an oxide layer is formed and planarized over the resultant structure of the prior processes, and then selectively etched to expose a predetermined portion of the surface of the gate wire 106 and the junction diode 110, forming a plurality of contact holes (h) therein. A metal wire is formed on the inter-level insulating layer 112 containing contact holes (h), and a CMP (or etch-back process) is performed on the metal wire to form conductivity plugs 114 in the contact holes h.

Figure 7D:
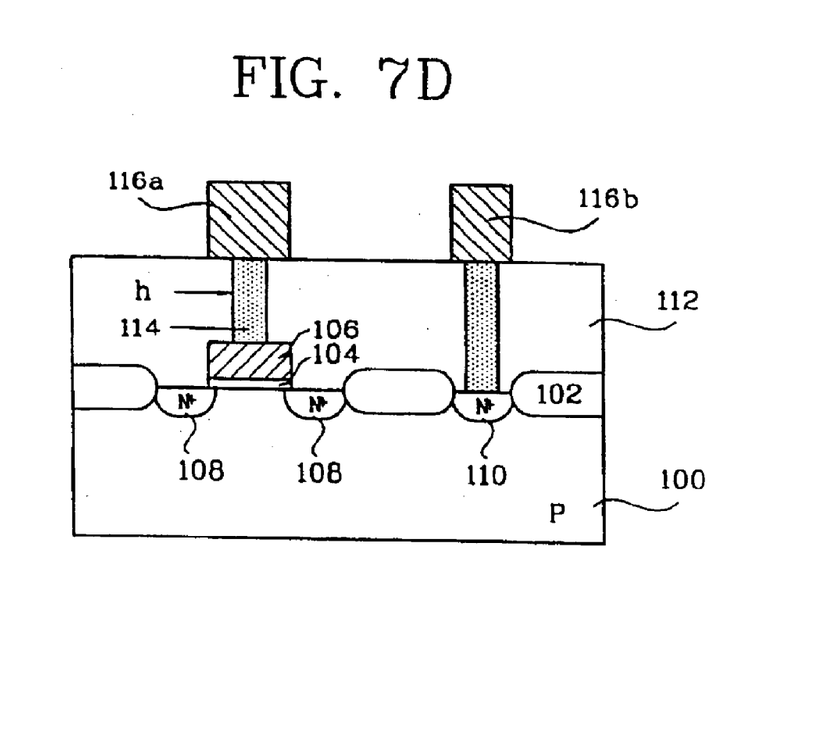

At the fourth step, as shown in FIG. 7D, a metal layer of Al alloy or Cu alloy is formed on the inter-level insulating layer 112 containing the conductivity plug 114. A photo resist layer (not shown) which simultaneously restricts a metal wire forming part and a dummy metal pattern forming part is used as a mask for sequentially etching the same, thereby completing all the fabricating steps. As a result, the metal wire 116a is formed over a predetermined portion of the inter-level insulating layer 112, integrally with the gate wire 106 through the conductivity plug 114. Similarly, the dummy metal pattern 116b is formed on the inter-level insulating layer 112 at a predetermined distance apart from the metal wire 116a, integrally with the junction diode 110 through the conductivity plug 114. The metal wire 116a is preferably oriented in parallel with the dummy metal pattern 116b on the inter-level insulating layer 112. As described above, the dummy metal pattern 116b can be configured in a double-folded (FIGS. 3 and 4) or linear striped (FIG. 5) shape.

The above-described embodiments ensure that if the semiconductor device having a structure as shown in FIG. 3 is constructed according to the sequential fabrication processes, even if plasma charge is generated during the plasma etching process of wire formation, substantially all of the plasma charge is discharged through the junction diode 110 toward substrate 100. Therefore, there will be no buildup of plasma charge at the gate insulating layer. As a result, deterioration of the gate insulating layer 104 is minimized to prevent a variety of defects such as reduction in device performance, and to ensure stability and consistency in device properties.

A second embodiment of the present invention will be described with reference to the accompanying drawings of FIGS. 8 through 12D.

Figure 8:
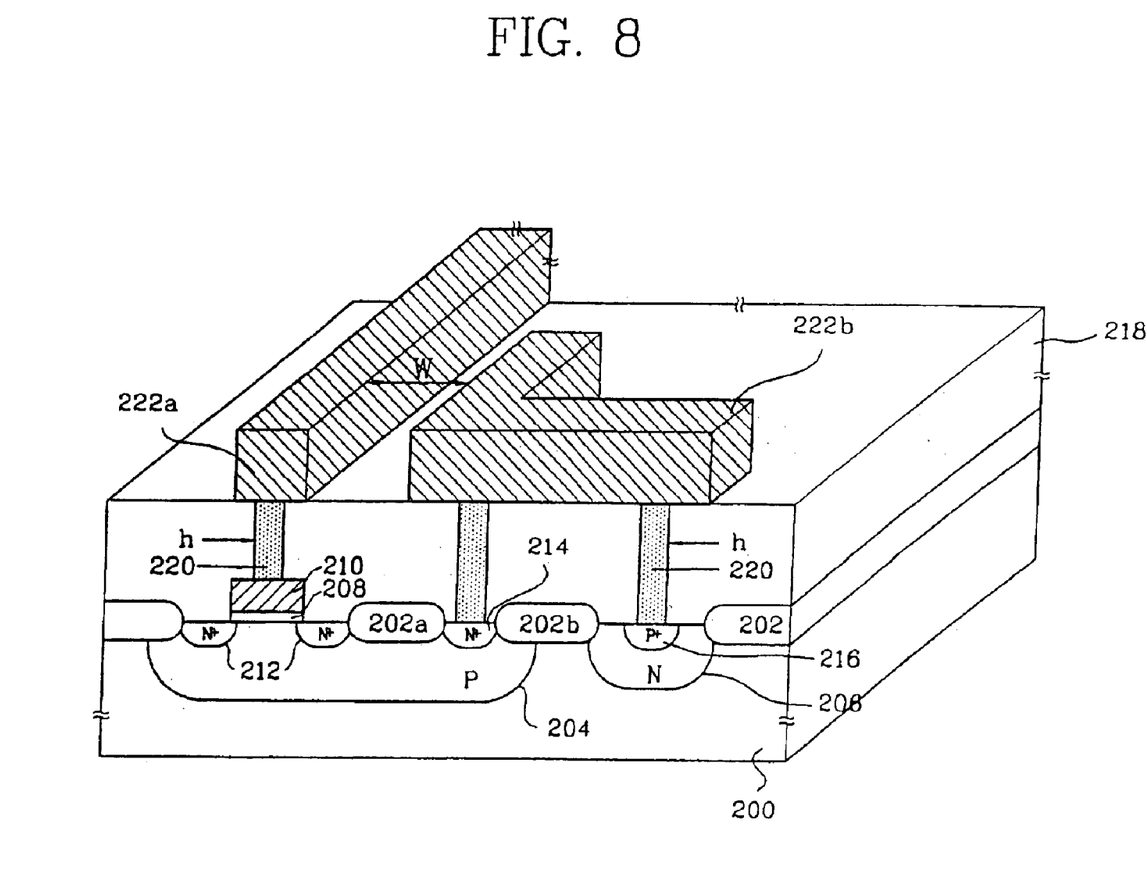
FIG. 8 is a cross-sectional perspective view of a semiconductor device having a bi-directional junction diode in accordance with a second embodiment of the present invention.
Figure 9:
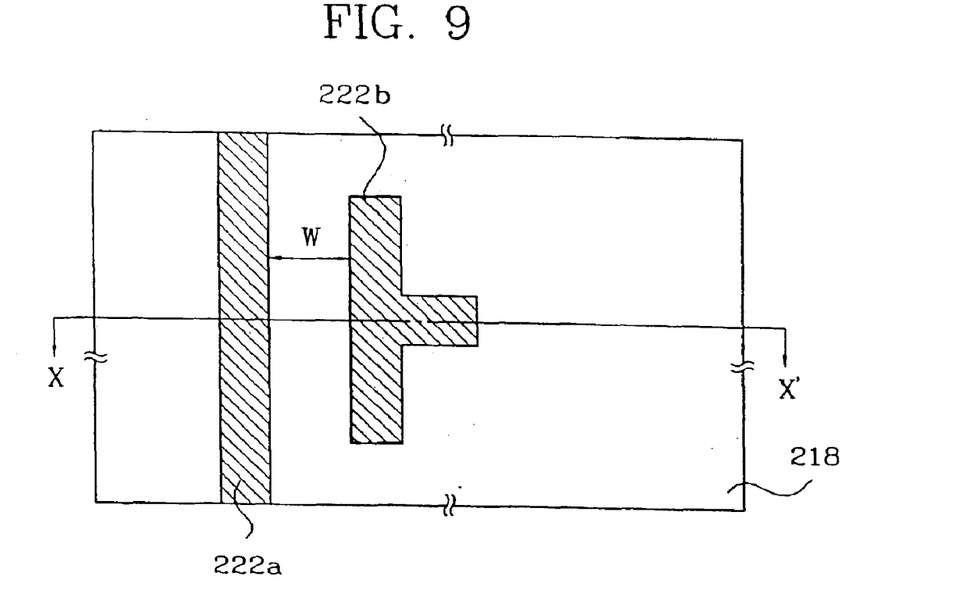
FIG. 9 is a top view of the semiconductor device of FIG. 8.
Figure 10:
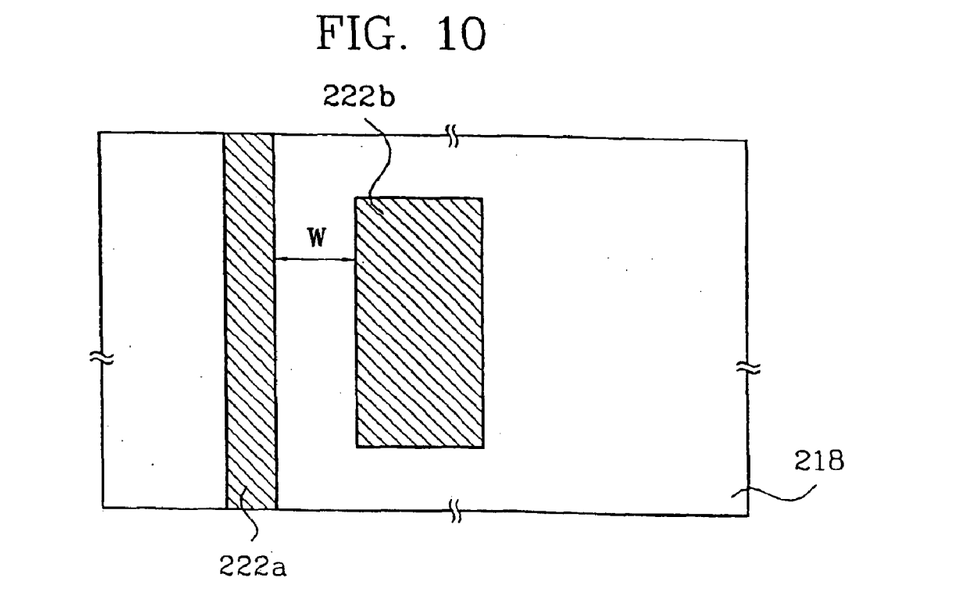
FIG. 10 is a top view of the semiconductor device of FIG. 8, illustrating an alternative embodiment.

FIG. 8 is a perspective view illustrating a cross-sectional structure of the semiconductor device having a bi-directional junction diode (N+/P diode and P+/N diode), for removing positive and negative plasma charges respectively, in accordance with the second embodiment of the present invention. FIG. 9 is a plane view of the perspective view in FIG. 8 as viewed from above. FIG. 10 is a plane view for illustrating a modified embodiment of the dummy metal pattern shown in FIG. 9. The cross-sectional view of FIG. 8 reveals is taken along line X–X' of FIG. 9.

In the second embodiment of the present invention, the only difference is in the type of impurity to be ion implanted, but other essential parts of the structure are the same, regardless of NMOS or PMOS applications. For the sake of example, an NMOS transistor structure of the semiconductor device will be described.

As shown in FIGS. 8 and 9, in accordance with the second embodiment of the present invention, a semiconductor device comprises: a field oxide layer 202 formed on a device isolating region of a semiconductor substrate 200 having a first conductivity well 204 (for instance, a P type well) and a second conductivity well 206 (for instance, an N type well) formed a predetermined distance apart from the first conductivity well 204, the distance being defined by the width of oxide layer 202a; a gate wire 210 formed over a predetermined portion of an active region of the first conductivity well 204 above a gate insulating layer 208; high-density second conductivity (for instance, N+0 type) source/drain regions 212 formed in the first conductivity well 204 of the active regions at both edges of the gate wire 210; a second conductivity (for instance, N+ type) material of a first junction diode 214 formed in the first conductivity well 204 of the source/drain region 212 in parallel to the gate wire 210; high-density first conductivity (for instance, P+ type) material forming a second junction diode 216 formed in the second conductivity well 206; an inter-level insulating layer 218 formed with a plurality of contact holes (h) over the resultant structure of the prior processes to expose predetermined portions of the surface of the gate wire 210 and the first and second junction diodes 214, 216; conductivity plugs (for instance, W plug) formed in the contact holes (h); a metal wire 222a longitudinally extending over a predetermined portion of the inter-level insulating layer electrically connected with the gate wire 210 through the conductivity plug 220; and a dummy metal pattern 222b disposed on the inter-level insulating layer 218 at a predetermined distance W apart from the metal wire 222a electrically connected with the first and second junction diodes 214, 216 through the conductivity plug 220, as being in parallel with the metal wire 222a.

The dummy metal pattern 222b is preferably formed in a multi-angular or rectangular shape, as shown in FIGS. 9 and 10. The former (as shown in FIG. 9) is preferred over the latter (as shown in FIG. 10) in consideration of high integration of the semiconductor device.

Furthermore, since the dummy metal pattern 222b and the metal wire 222a are simultaneously formed during the same etching process, they can be made of an identical material. It is preferable in terms of high integration of the device to provide a dummy metal pattern 222b that is shorter in length than the metal wire 222a.

In addition, it is preferable that the gap width W between the metal wire 222a and the dummy metal pattern 222b is provided at less than 2 μm in order to maximize the quantity of plasma charge to be discharged toward the substrate in the plasma etching process. The width W is defined as the minimum horizontal distance between the metal wire 222a and the dummy metal pattern 222b, as described above.

Figure 11:
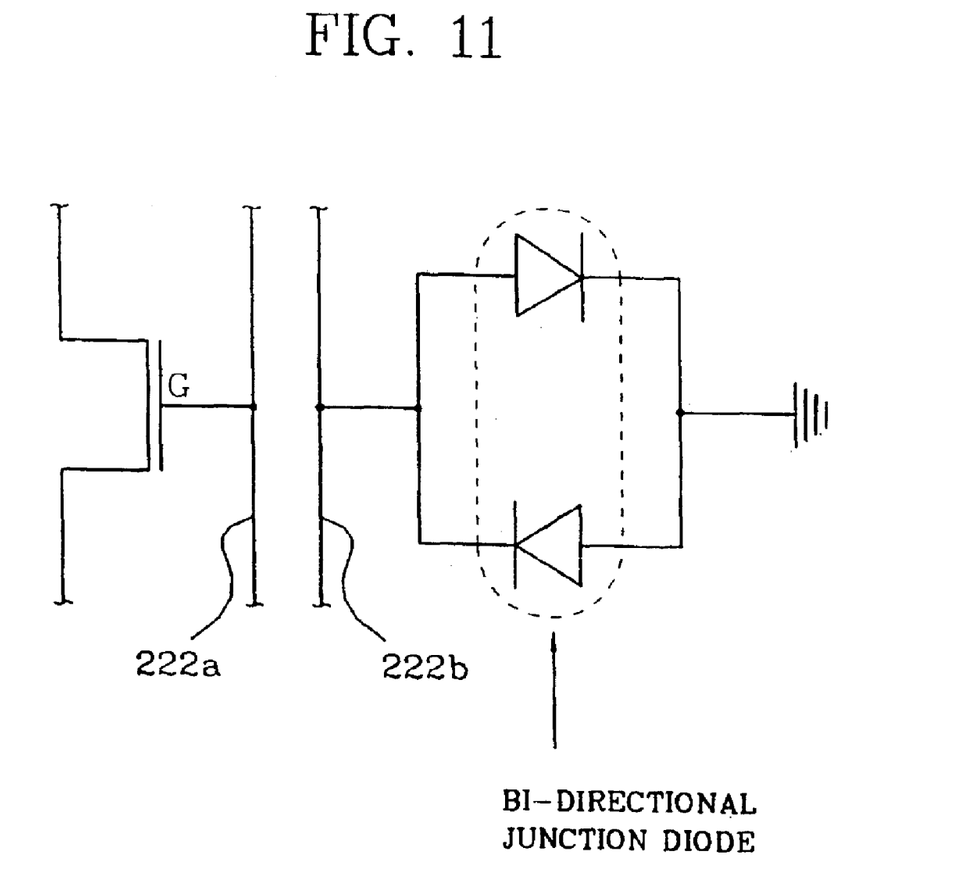
FIG. 11 is an equivalent schematic circuit diagram for the device of FIG. 8.

FIG. 11 is an equivalent circuit diagram of the semiconductor device shown in FIG. 8. As shown in the circuit diagram, the metal wire 222a is connected to the gate wire G of the NMOS transistor, and the first junction diode (N+/P diode), and the second junction diode (P+/N diode) positioned apart from the gate wire G are electrically connected through the dummy metal pattern 222b. As a consequence, it can be confirmed that the device is constructed for promoting the flow of plasma charge generated during the plasma etching process to flow through the diode toward the substrate.

A semiconductor device thus constructed can be fabricated according to the following four steps as shown in the sequential fabricating processes of FIGS. 12A through 12D.

Figure 12A:
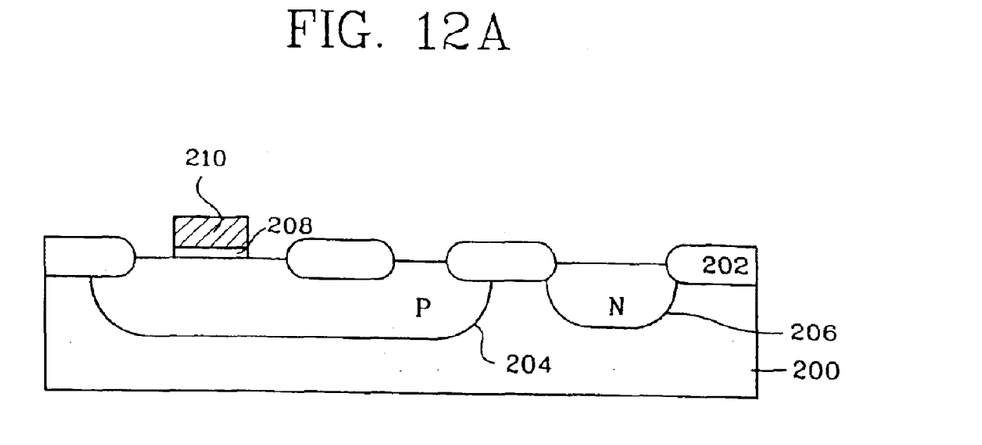
FIGS. 12A through 12D illustrate sequential steps for fabricating the semiconductor device shown in FIG. 8.

During the first step, as shown in FIG. 12A, an active region is defined by forming a field oxide layer 202 at a device isolating region of a semiconductor substrate 200. First and second conductivity wells 204, 206 are formed in a predetermined portion of the substrate 200 by sequentially ion-implanting first and second conductivity (for instance, P type and N type) impurities. Accordingly, a gate insulating layer 208 is formed at the active region of the substrate 200, and a metal layer of polysilicon or polycide is formed over the resultant structure of the prior processes. Next, a photo resist pattern (not shown) that defines the gate wire pattern is used as a mask for sequentially etching the metal layer and the gate insulating layer 208 to form a gate wire 210 at the active region of the substrate 200.

Figure 12B:
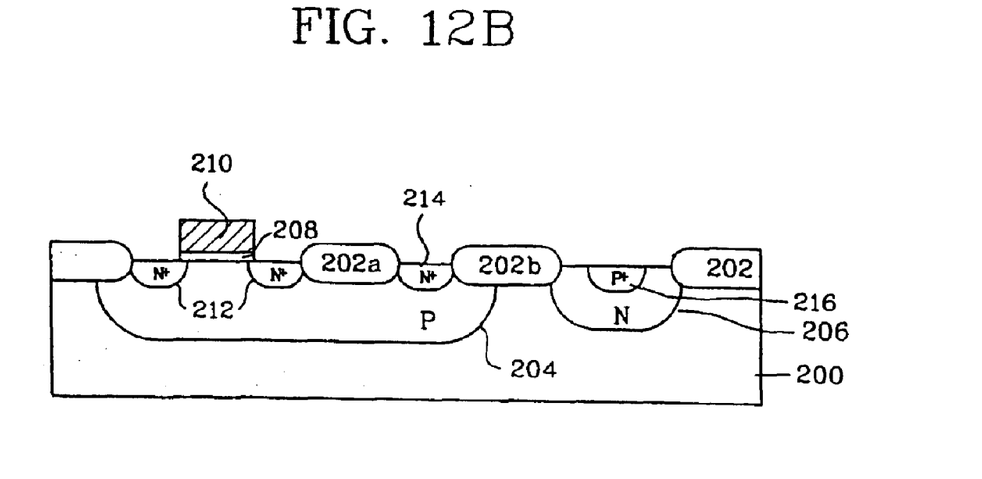

At the second step, as shown in FIG. 12B, a high density of a second conductivity (for instance, N+ type) impurity is selectively ion-implanted to define transistor components (source and drain regions 212) and an active region 214 of the first conductivity well 204. As a result, source/drain regions 208 are formed in the first conductivity well 204 at both edges of the gate wire 210, and a second conductivity junction diode (N+/P diode) 214 is formed in the first conductivity well 204 at a predetermined distance apart from the source/drain region 212, the distance being defined by the width of field oxide portion 202a. Next, a high density of the first conductivity (for instance, P+0 type) impurity is selectively ion-implanted in a predetermined active region of the second conductivity well 206 to form a second junction diode (P+/N diode) 216 in the second conductivity well 206 at a predetermined distance from the first junction diode 214, the distance being defined by the width of field oxide portion 202b. The gate wire 210 and the first and second junction diodes 214, 216 are preferably oriented substantially parallel to each other.

Figure 12C:
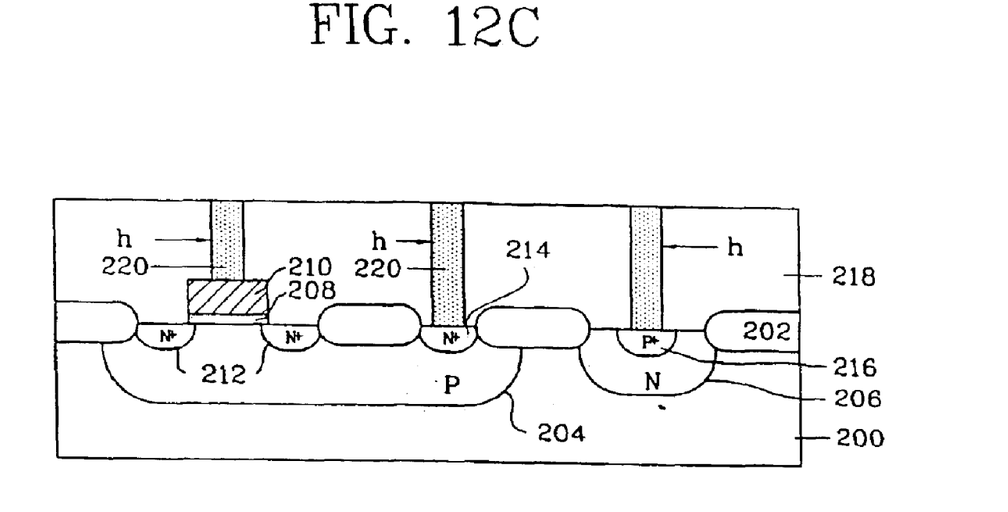

During the third step, as shown in FIG. 12C, an inter-level insulating layer 218 of an oxide layer is formed and planarized over the resultant structure of the prior processes, and then the inter-level insulating layer 218 is selectively etched to form a plurality of contact holes (h) to expose predetermined portions of the surface of the gate wire 210 and the first and second junction diodes 214, 216. A metal wire layer (for example W plug material) is formed on the inter-level insulating layer 218 containing contact holes (h), and a CMP (or etch-back process) is performed to the metal wire to form conductivity plugs 220 in the contact holes (h).

Figure 12D:
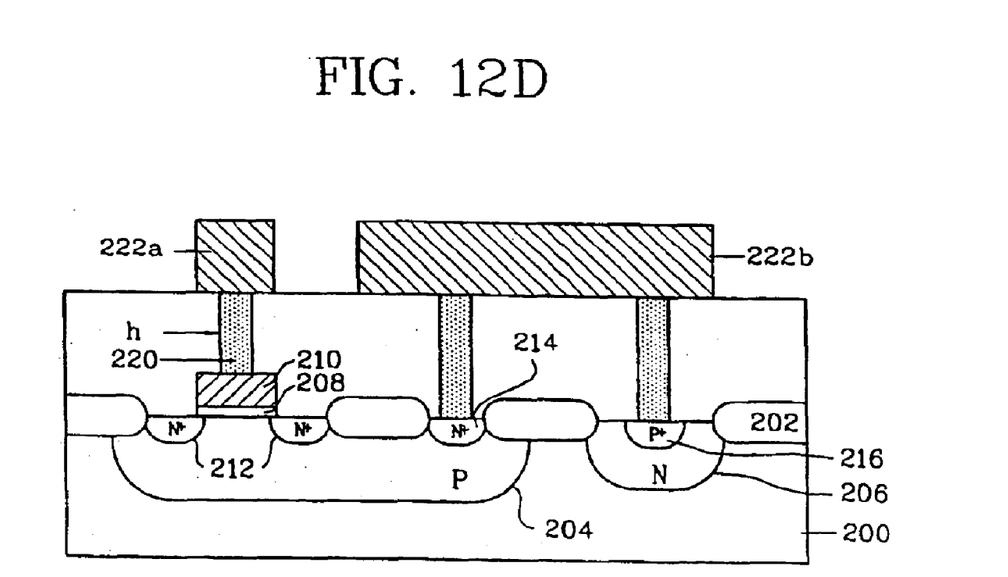

During the fourth step, as shown in FIG. 12D, a metal layer of Al alloy or Cu alloy is formed on the inter-level insulating layer 218 containing the conductivity plugs 220. A photo resist layer (not shown) which simultaneously defines the metal wire pattern and a dummy metal pattern is used as a mask for sequentially etching the same, thereby completing the fabrication steps. As a result, the metal wire 222a is formed over a predetermined part of the inter-level insulating layer 218, being integral with the gate wire 210 through the conductivity plug 220, and the dummy metal pattern 222b is formed over the inter-level insulating layer 218 at a predetermined distance apart from the metal wire 222a, being integral with the first and second junction diodes 214, 216 through the conductivity plugs 220. The metal wire 222a is preferably oriented in parallel with the dummy metal pattern 222b on the inter-level insulating layer 218. As described above, the dummy metal pattern 116b is preferably formed in a multi-angular shape as shown in FIG. 9.

In this manner, if the semiconductor device having the structure shown in FIG. 8 is constructed according to the aforementioned sequential fabricating processes, substantially all plasma charge generated during wire formation is discharged through the first and second junction diodes 214, 216 toward substrate 200. Therefore, there will be no blockage of the plasma charge in the gate insulating layer 204. As a result, deterioration of the gate insulating layer 104 is minimized, thereby mitigating a variety of defects such as reduction in device performance, and maintaining consistent and stable device properties.

Although the aforementioned embodiments relate to NMOS devices, the present invention is equally applicable to PMOS devices.

As described above, the configurations and methods of the present invention promote the flow of plasma charge generated during the process metal wire formation toward the substrate via the dummy metal pattern and diode, preventing accumulation of the plasma charge in the gate insulating layer, thereby preventing deterioration of the gate insulating layer. This results in improved semiconductor device performance.

While this invention has been particularly shown and described with references to preferred embodiments thereof, it will be understood by those skilled in the art that various changes in form and detail may be made herein without departing from the spirit and scope of the invention as defined by the appended claims.

What is claimed is:

1. A method for fabricating a semiconductor device comprising:

forming a gate wire over a gate insulating layer on a predetermined portion of an active region of a semiconductor substrate of a first conductivity-type;

forming source/drain regions in the substrate at opposite edges of the gate wire by selectively ion-implanting a high density of an impurity of a second conductivity-type;

forming a junction diode of the second conductivity-type in the substrate at a predetermined distance apart from the source/drain regions;

forming an inter-level insulating layer having a plurality of contact holes to expose predetermined portions of the gate wire and junction diode;

forming conductivity plugs in the contact holes;

forming a metal layer on the inter-level insulating layer; and simultaneously forming a metal wire coupled to the gate wire, and a dummy metal pattern coupled to the junction diode by selectively etching the metal layer to expose predetermined portions of a surface of the inter-level insulating layer.

2. The method, as defined in claim 1, wherein the metal wire and junction diode comprise Al alloy or Cu alloy.

3. The method, as defined in claim 1, wherein the dummy metal pattern is formed in a linear strip or double-folded shape.

4. The method, as defined in claim 1, wherein the metal wire and the dummy metal pattern are oriented to be substantially parallel.

5. The method, as defined in claim 1, wherein the dummy metal pattern is shorter than the metal wire.

6. The method, as defined in claim 1, wherein the metal wire and the dummy metal pattern are formed to be spaced apart at a distance of less than 2 micrometers.

7. A method for fabricating a semiconductor device comprising:

sequentially forming a well of a first conductivity-type and a well of a second conductivity-type in a semiconductor substrate;

forming a gate wire over a gate insulating layer on a predetermined portion of the well of the first conductivity-type;

forming source/drain regions in the well of the first conductivity-type at opposite edges of the gate wire by selectively ion implanting a high density of an impurity of the second couductivity-type in the well of the first conductivity-type;

forming a second conductivity-type first junction diode in the well of the first conductivity-type at a predetermined distance apart from the source/drain regions;

forming a first conductivity-type second junction diode in the well of the second conductivity-type at a predetermined distance from the first junction diode;

forming a second junction diode formed in the well of the second conductivity-type at a predetermined distance apart from the first junction diode by selectively ion-implanting a high density of an impurity of the first conductivity-type in the well of the second conductivity-type;

forming an inter-level insulating layer over the gate wire and the first and second junction diodes, the inter-level insulating layer including a plurality of contact holes to expose predetermined portions of the gate wire and first and second diodes;

forming conductivity plugs in the contact holes;

forming a metal layer on the inter-level insulating layer;

simultaneously forming a metal wire coupled to the gate wire, and a dummy metal pattern coupled to the first and second junction diodes by selectively etching the metal layer to expose predetermined portions of the surface of the inter-level insulating layer.

8. The method, as defined in claim 7, wherein the metal wire and junction diode comprise Al alloy or Cu alloy.

9. The method, as defined in claim 7, wherein the dummy metal pattern is formed in a multi-angular shape.

10. The method, as defined in claim 7, wherein the metal wire and the dummy metal pattern are in longitudinal parallel on the inter-level insulating layer.

11. The method, as defined in claim 7, wherein the dummy metal pattern is shorter in length than the metal wire.

12. The method, as defined in claim 7, wherein the metal wire and the dummy metal pattern are spaced apart a distance of less than 2 micrometers.

* * * * *